United States Patent
Devlin et al.

Patent Number: 5,648,740
Date of Patent: Jul. 15, 1997

[54] SWITCHING ARRANGEMENT WITH COMBINED ATTENUATION AND SELECTION STAGE

[75] Inventors: Liam Michael Devlin; Brian Jeffrey Buck, both of Northampton, United Kingdom

[73] Assignee: GEC-Marconi Limited, United Kingdom

[21] Appl. No.: 538,968

[22] Filed: Oct. 5, 1995

[30] Foreign Application Priority Data

Nov. 3, 1994 [GB] United Kingdom ............... 9422186

[51] Int. Cl.$^6$ ............................................. H03K 17/693
[52] U.S. Cl. ........................... 327/408; 327/308; 327/328
[58] Field of Search ................................. 327/308, 310, 327/321, 327, 328, 407, 408, 560, 99, 427, 437

[56] References Cited

U.S. PATENT DOCUMENTS

| | | | |
|---|---|---|---|
| 4,369,414 | 1/1983 | Aoki et al. | 333/81 R |
| 4,787,686 | 11/1988 | Tajima et al. | 327/328 |
| 4,837,530 | 6/1989 | Kondoh | 327/328 |
| 4,875,023 | 10/1989 | Maoz | 327/328 |
| 4,959,873 | 9/1990 | Flynn et al. | 327/408 |
| 4,978,932 | 12/1990 | Gupta et al. | 327/328 |
| 4,996,504 | 2/1991 | Huber et al. | 327/327 |
| 5,006,735 | 4/1991 | Taylor | 327/308 |
| 5,281,928 | 1/1994 | Ravid et al. | 327/308 |
| 5,309,048 | 5/1994 | Khabbaz | 327/310 |
| 5,345,123 | 9/1994 | Staudinger et al. | 327/308 |
| 5,448,207 | 9/1995 | Kohama | 327/308 |

*Primary Examiner*—Timothy P. Callahan
*Assistant Examiner*—My-Trang Nu Ton
*Attorney, Agent, or Firm*—Kirschstein, et al.

[57] ABSTRACT

A switching arrangement for establishing a signal path between any one of a plurality of first ports and a common port and for varying the attenuation of at least one of the ports comprises in the signal path of each attenuatable port a first switching element and attenuating circuitry connectable by further switching circuitry across the first switching element, the first switching element constituting the sole series element in that path. The attenuating circuitry comprises a resistive network and the further switching circuitry comprises second switching elements connected to respective ends of the first switching element and to respective points of the resistive network for introducing one of a number of resistive states into the signal path. The relevant port is isolated either by switching the first and second switching elements OFF, or by switching OFF the first element and also a third switching element connected in series between a second switching element and that end of the first switching element which lies downstream in the signal flow path. The switching elements may be FETs and the switching arrangement may take the form of a single-pole, double-throw (SPDT) switch or a switch of any number of "poles" or "throws".

9 Claims, 2 Drawing Sheets

SWITCHING ARRANGEMENT WITH COMBINED ATTENUATION AND SELECTION STAGE

BACKGROUND OF THE INVENTION

The invention concerns a switching arrangement for establishing any one of a plurality of selectable signal paths between a corresponding plurality of first ports and a common port and for varying the attenuation of at least one of the selectable signal paths.

Circuits are known which allow the establishing of a signal path between any one of a number of first ports and a second, common port and which also allow the signal flowing along that path to experience a desired degree of attenuation.

FIG. 1 shows such a known arrangement in the form of an SPDT (single-pole, double-throw) switch and comprises two first ports 11 and 12 and a second, common port 13. Two FETs 14 and 15 act as port-select elements for establishing, as required, a signal path between a selected one of the ports 11 and 12 and the common port 13. If required, a further FET 16 may be included to provide a shunt path for enhanced isolation of port 12 from the common port 13 when FET 15 is switched into non-conducting mode. Port selection is achieved by the application of control signals C and $\bar{C}$ on the gates of FETs 14, 15 and 16, FETs 14 and 16 being driven in antiphase to FET 15. One of the first ports, 11, has included in the signal path an attenuating means 17 which comprises a resistive network 18 and two attenuation switching elements in the form of FET switches 19 and 20. The switches 19 and 20 are controlled in antiphase at their gates via control signals P and $\bar{P}$, respectively, such that, when P is zero volts and $\bar{P}$ is, say, −5 V, FET 19 forms a through-path of low impedance for the signal on port 11, while FET 20 is switched into a non-conductive state to remove any loading effect of the network 18 on the incoming signal, especially at the downstream end of the FET 19.

In contrast, when P is set to −5 V and $\bar{P}$ is set to 0 V, the signal path includes the unshunted network 18 and the signal on port 11 is therefore attenuated when it reaches port 13.

The two functions of attenuation and port selection are completely independent in this arrangement, such that any setting of the attenuation means 17 will be rendered ineffective until such time as FET 14 is switched into conduction. This occurs by the application of a zero-volt level on its gate (and on the gate of FET 16, as required), FET 15 being at the same time rendered non-conductive with the application of a −5 V signal on its gate.

This known arrangement has the drawback that when port 11 is selected and the attenuation is set to nominally zero by the placing of a zero-volt signal on the gate of FET 19, the signal path from port 11 to the common port 13 contains two series-connected FET ON-impedances associated with FETs 19 and 14, as opposed to only one such impedance (that associated with FET 15) in the signal path from port 12 to port 13. This gives rise to a higher absolute value of series resistance in the series path than may be desirable for the "zero-attenuation" state. In addition, there may be a significant imbalance between the amplitude of the two signals selectively fed to the common port 13, though this depends on the magnitude of losses which may occur elsewhere in the signal paths.

It is desirable to provide a switching arrangement which overcomes or mitigates the above drawbacks of the known arrangement.

SUMMARY OF THE INVENTION

In accordance with the invention, there is provided a switching arrangement for establishing any one of a plurality of selectable signal paths between a corresponding plurality of first ports and a common port and for varying the attenuation of at least one of the selectable signal paths, wherein each path whose attenuation is to be varied comprises a first switching element in a path between the relevant first port and the common port and attenuating means connectable by further switching means across the first switching element, the first switching element constituting the sole series switching element in that path.

By arranging for only one switching element to be situated as a series element in the signal path, the resistance of the signal path is kept to a minimum and may, depending on losses occurring at other points along each path in a practical application of the invention, more closely balance the ON-resistance existing in other, non-attenuatable, signal paths in the switching arrangement.

The attenuating means may comprise a resistive network and the first switching element and the further switching means may be configured such that they can introduce into the relevant signal path one of a plurality of resistive states in dependence on corresponding switching states applied to the first switching element and to the further switching means. The resistive states may be a nominal short-circuit, a nominal open-circuit or one or more finite resistive states of the resistive network.

The further switching means may comprise one or more pairs of second switching elements, corresponding halves of the one or more pairs of second switching elements being connected between respective parts of the resistive network and an end of the first switching element which is connected to the relevant first port and an end of the first switching element which is connected to the common port, respectively.

The switching arrangement may comprise a switching-state generator for generating the switching states to be applied to the first and second switching elements, the switching-state generator being arranged in a first case to switch the first switching element and the one or more pairs of second switching elements OFF, so as to deselect the relevant port, in a second case to switch the first element ON, so as to provide a nominally short-circuit resistive state, and in a third case to switch the first switching element OFF and a selected one of the one or more pairs of second switching elements ON, so as to provide a selected finite resistive state of the resistive network.

The switching arrangement may comprise a third switching element connected in series with each of those corresponding halves of the one or more pairs of second attenuation switching elements which are connected to that end of the first switching element which is situated downstream in terms of signal flow along the relevant signal path.

Use of such a third switching element may be required where the switching arrangement of the invention is to be used in electronic circuitry where the port-selection function and the attenuation-selection function are to be kept largely separate.

The switching arrangement may comprise a switching-state generator for generating the switching states to be applied to the first, second and third switching elements, the switching-state generator being arranged in a first case to switch the first switching element and the third switching element OFF, so as to deselect the relevant port, in a second case to switch the first switching element ON, so as to provide the nominally short-circuit resistive state, and in a third case to switch the first switching element OFF, the third switching element ON and a selected one of the one or more pairs of second switching elements ON, so as to provide a selected finite resistive state of the resistive network.

The switching arrangement may comprise one pair of second switching elements and one third switching element, the one pair of second switching elements being switchable in antiphase to the first switching element.

The resistive network may be a pi-network or alternatively a T-network.

The first, second and third switching elements may be FETS.

BRIEF DESCRIPTION OF THE DRAWINGS

The invention will now be described, by way of example only, with reference to the drawings, of which.

DETAILED DESCRIPTION OF EMBODIMENTS OF THE INVENTION

Figure 1:
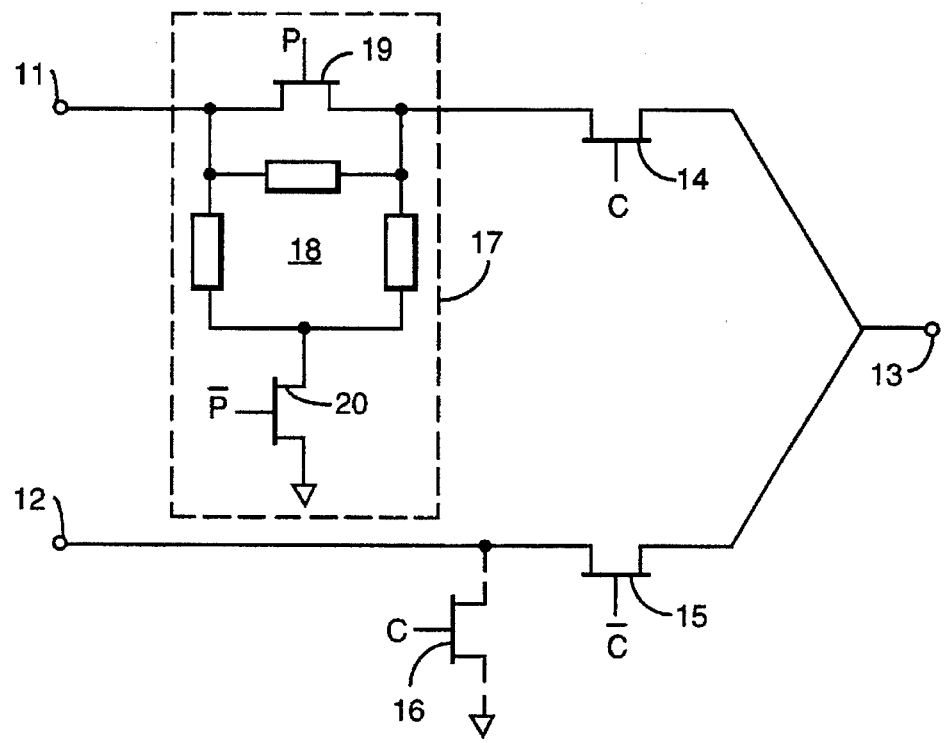
FIG. 1 is a circuit diagram of a known SPDT switching arrangement incorporating selective attenuation according to the prior art.
Figure 2:
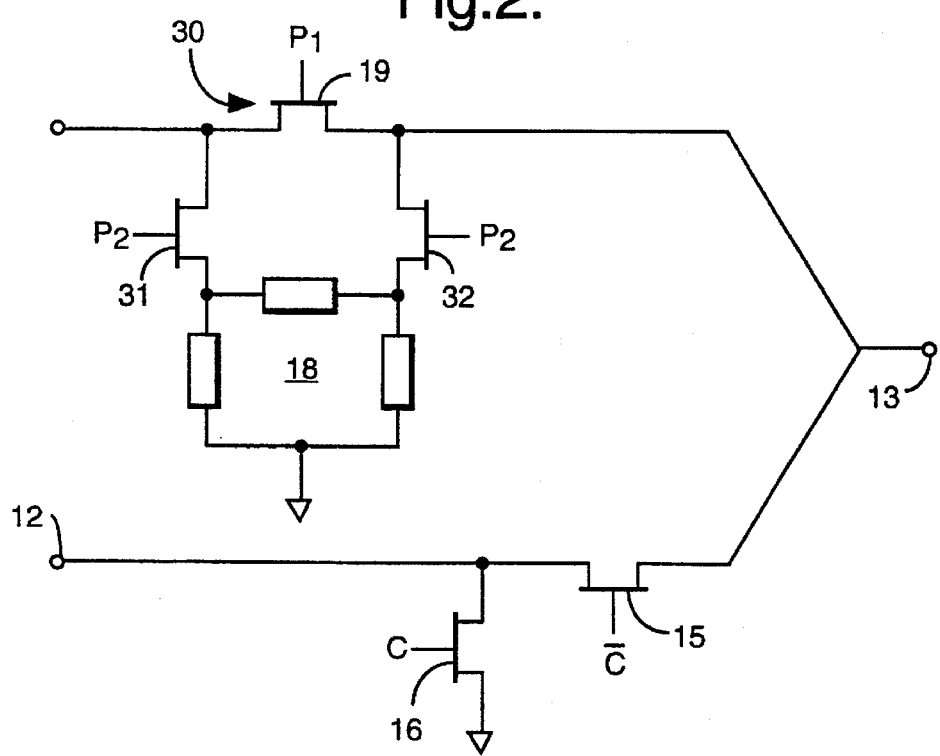
FIG. 2 is a circuit diagram of a first embodiment of a switching arrangement according to the invention.

Referring now to FIG. 2, in FIG. 2 an SPDT switching arrangement according to the invention effectively integrates the two functions of port selection and signal attenuation into one stage 30. The series attenuation switching element seen in FIG. 1 is retained as a first switching element, FET 19, for the shunting of the resistive network 18, but this time the FET 20 in FIG. 1 is replaced by a pair of second switching elements, FETs 31 and 32, connected between respective ends of the resistive network 18 and respective ends of the first switching element, FET 19. It is assumed in this embodiment that the other limb of the switching arrangement, i.e. port 12, does not contain an attenuation means, but is controlled solely by the series-connected FET 15 and the shunt-connected FET 16, as in FIG. 1.

The truth table for this arrangement is given below:

| C (volts) | $\bar{C}$ (volts) | $P_1$ (volts) | $P_2$ (volts) | FUNCTION |
| --- | --- | --- | --- | --- |
| 0 | −5 | −5 | −5 | Port 12–Port 13: OFF Port 11–Port 13: OFF |
| 0 | −5 | 0 | −5 | Port 12–Port 13: OFF Port 11–Port 13: low loss |
| 0 | −5 | −5 | 0 | Port 12–Port 13: OFF Port 11–Port 13: high loss |
| −5 | 0 | −5 | −5 | Port 12–Port 13: ON Port 11–Port 13: OFF |

Thus, it can be seen that the part played in FIG. 1 by the FET 14 is now taken over by the attenuator switching section 30, and in particular when both the first switching FET 19 and the pair of second switching FETs 31 and 32 are switched OFF. Other switching states of the three FETs 19, 31 and 32 provide either a nominal short-circuit (no attenuation) or a high impedance (attenuation present) along the signal path. It will be appreciated that the ON-state resistance of the various FETs used in the switching arrangement will not be zero ohms, but will be somewhat greater than this (e.g. 10 ohms), depending on the devices used. Thus reference is made to "nominal" short-circuit and also, analogously, to "nominal" open-circuit.

Figure 3:
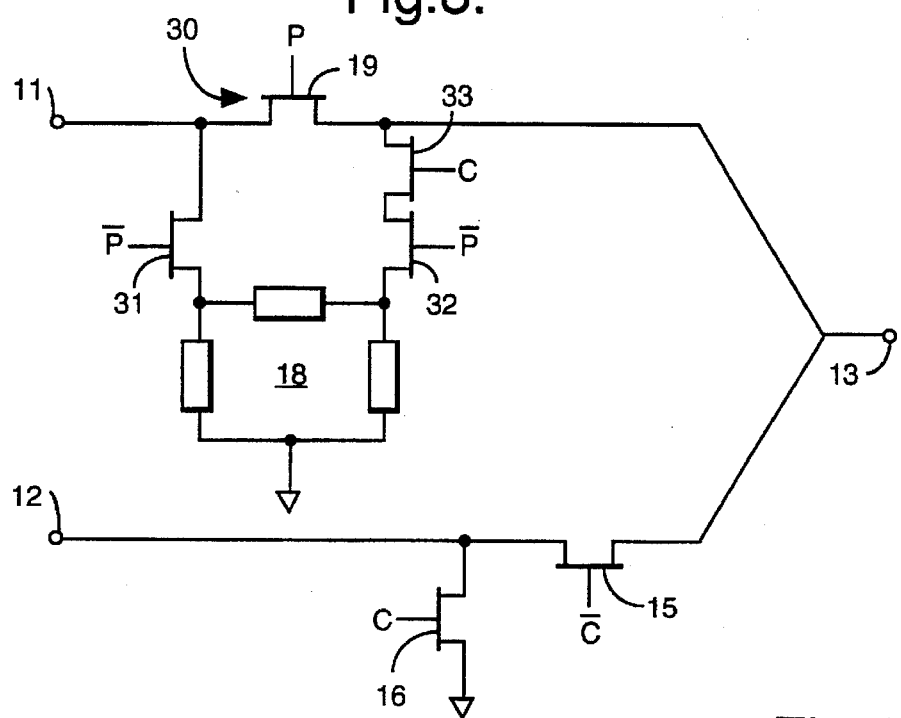
FIG. 3 is a circuit diagram of a second embodiment of a switching arrangement according to the invention.

The above embodiment presupposes a situation in which both $P_1$ and $P_2$ can take the same value, i.e. −5 V. In many applications, however, it will be desirable to keep $P_1$ and $P_2$ as the complement of each other, i.e. to have $P_2=\bar{P}_2$. This might well be the case where the switching elements are being driven from existing drivers having readily available output complements. Under these circumstances, the embodiment shown in FIG. 2 can be modified by the inclusion of a third switching element, FET 33, in series with the existing FET 32. This is illustrated in FIG. 3. Now the drive signals on the gates of FETs 31 and 32 can be allowed to be high (FETs 31, 32 conducting) while the drive signal on the gate of FET 19 is low (FET 19 non-conducting) provided, in order to isolate port 11, the additional third switching element, FET 33, is switched OFF by a low on its gate (signal C=−5 V). This will be the case, since when port 11 is not switched through to the common port 13, port 12 will be switched through (i.e. $\bar{C}$ will be high (0 V)).

The truth table for this second embodiment is given below:

| C (volts) | $\bar{C}$ (volts) | P (volts) | $\bar{P}$ (volts) | FUNCTION |
| --- | --- | --- | --- | --- |
| 0 | −5 | 0 | −5 | Port 12–Port 13: OFF Port 11–Port 13: low loss |
| 0 | −5 | −5 | 0 | Port 12–Port 13: OFF Port 11–Port 13: high loss |
| −5 | 0 | −5 | 0 | Port 12–Port 13: ON Port 11–Port 13: OFF |
| −5 | 0 | 0 | −5 | Non-used state. |

It is evident that the final state in the above truth table is disallowed since, were FET 19 to be rendered conductive while the third switching element, FET 33, was OFF, this would have the effect of overriding the normal port selection function of the circuit carded out by way of the FETs 33 and 15.

Figure 4:
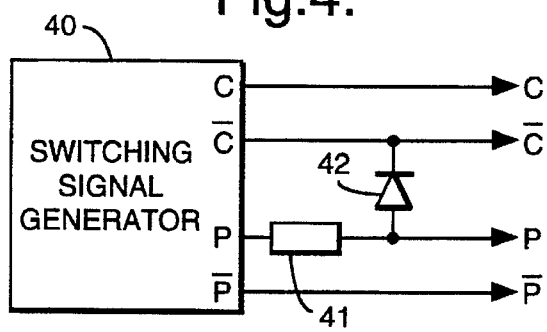
FIG. 4 is a circuit diagram illustrating one way in which the non-used state shown in the truth table for FIG. 3 may be prevented.

One way of ensuring that this disallowed state does not occur is shown in FIG. 4. In FIG. 4, a switching signal generator stage 40 supplies the various switching signals C, $\bar{C}$, P, $\bar{P}$ to the switching circuit, but includes also an interlock in the form of a resistor 41 and a diode 42. Now, when the signal $\bar{C}$ is low (−5 V), the line P is held low also via the diode 42, thereby maintaining FET 19 in its OFF state. However, as soon as signal $\bar{C}$ goes high (0 V), signal P may take either of its two usual values, namely −5 V or 0 V, depending on whether or not attenuation is required.

Although the invention has so far been described in terms of its embodiment as an SPDT switch, the invention may nevertheless be employed in any kind of switch configuration of no matter how many "poles" or "throws". Clearly, where more than two "throws" are involved, the switching signals on the gates of the third switching elements (shown as transistors 33 and 15 in the double-throw configuration of FIG. 3) will be arranged such that only the desired port will be coupled to the common port 13. Only one third switching element will normally therefore be ON, the rest being rendered non-conductive in order to isolate those ports which are not required. Where more than one "pole" is employed, it is simply a question of duplicating the basic attenuating/selecting switching arrangement shown in FIG. 2 or FIG. 3 in the other poles involved.

Figure 5:
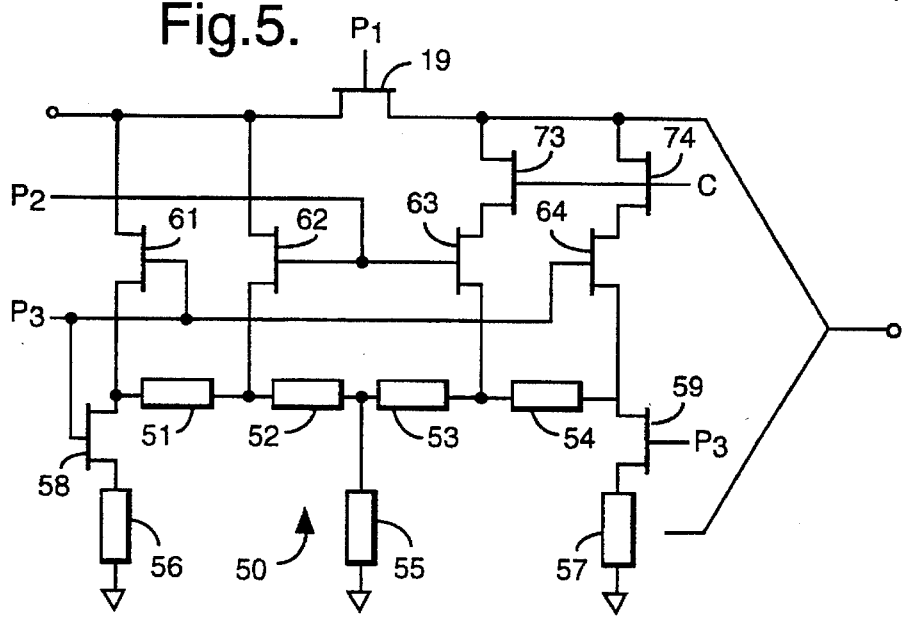
FIG. 5 is a circuit diagram of a third embodiment of a switching arrangement according to the invention.

In addition, it is possible to arrange for the resistive network 18 and the first and second switching elements (shown as FETs 19, 31 and 32 in FIGS. 2 and 3) to provide more than two attenuation states in the signal path concerned. Such an arrangement is shown as a third embodiment of the invention in FIG. 5, in which the resistive network is configured as a T-network 50 comprising two pairs of series elements 51 & 54 and 52 & 53 and a shunt element 55. The first switching element 19 is retained as before, but now two pairs of second switching elements in the form of FETs 61 & 64 and FETs 62 & 63 are provided. The resistor pair 51 & 54 are taken to respective ends of the first switching element 19 by way of the transistor pair 61 & 64 and the resistor pair 52 & 53 are taken to respective ends of the first switching element 19 by way of the transistor pair 62 & 63. In series with the FETs 63 and 64 are connected two third switching elements, FETs 73 and 74, respectively, following the second embodiment shown in FIG. 3. These are driven in parallel by a signal C on their gate. The FET pairs 61 & 64 and 62 & 63 are likewise driven in parallel from signals P3 and P2, respectively. Signal P3 also switches in a pair of matching resistors 56, 57 by means of respective FETs 58, 59. FET 19 is driven from a control signal P1.

In operation, only one of signals P1–P3 is driven high to present a particular network impedance to the signal path. The operation of the rest of the circuit is as described for the embodiment of FIG. 3.

While the switching elements have been assumed to take the form of FETs, in practice any suitable form of switching device may be employed, the invention being of most value where the ON resistance value of the devices concerned is appreciable.

Also, although the switching arrangements of FIGS. 2 and 3 have assumed an SPDT arrangement in which a signal on one of the two ports 11 and 12 (the "input" ports) is to be switched through to the common port 13 (the "output" port), it is possible, where the switching elements are bidirectional devices, e.g. JFETs, to have the reverse arrangement in which a signal on the common port 13 is to be switched through to one of the other ports 11, 12. Signal flow is then from right to left and it is necessary in such a case to dispose the third switching element 33 (FIG. 3) or the corresponding elements 73 and 74 (FIG. 5) downstream of the signal flow, i.e. to the left of the first switching element 19.

With the switching arrangement shown in FIG. 2, it is possible to achieve a non-attenuating loss (i.e. shunting transistor 19 switched ON, FETs 31 and 32 switched OFF, FET 14 switched ON) of only 0.25 dB compared with around 1 dB for the known arrangement of FIG. 1.

We claim:

1. A switching arrangement for establishing any one of a plurality of selectable signal paths between a corresponding plurality of first ports and a common port, and for providing attenuation in at least one of said signal paths, each path in which attenuation is to be provided comprising:
   a) a series switching element connected between a relevant first port and said common port, said series switching element having first and second signal terminals and a control terminal;
   b) an impedance network having an input terminal and an output terminal;
   c) first and second further switching elements each having first and second signal terminals and a control terminal; and
   d) a control means connected to said control terminals of said series and further switching elements,
   said first signal terminals of said first and second further switching elements being connected to said first and second signal terminals, respectively, of said series switching element, and
   said second signal terminals of said first and second further switching elements being connected to said input terminal and said output terminal, respectively, of said impedance network,
   said control means being configured to enable a selection of any one of all of the following states:
      i) a substantially zero-attenuation state, in which said series switching element is switched into a conducting state, and said further switching elements are switched into a non-conducting state;
      ii) an isolation state, in which said series and further switching elements are switched into a non-conducting state; and
      iii) a finite attenuation state, in which said series switching element is switched into a non-conducting state, and said further switching elements are switched into a conducting state.

2. The switching arrangement as claimed in claim 1, comprising also a further series switching element connected between a first port associated with a path in which no attenuation is provided and said common port, said further series switching element having a control terminal connected to said control means, said control means being configured to switch said further series switching element into a conducting state when said path is selected and into a non-conducting state when said path is not selected.

3. The switching arrangement as claimed in claim 1, wherein said switching elements are FETs.

4. A switching arrangement for establishing any one of a plurality of selectable signal paths between a corresponding plurality of first ports and a common port, and for providing attenuation in at least one of said signal paths, each path in which attenuation is to be provided comprising:
   a) a series switching element connected between a relevant first port and said common port, said series switching element having first and second signal terminals and a control terminal;
   b) an impedance network having an input terminal and an output terminal;
   c) first, second and third further switching elements each having first and second signal terminals and a control terminal; and
   d) a control means connected to said control terminals of said series and further switching elements,
   said first and second signal terminals of said first further switching element being connected to said first signal terminal of said series switching element and to said input terminal of said impedance network, respectively,
   said second and third further switching elements being connected in series by their signal terminals between said output terminal of said impedance network and said second signal terminal of said series switching element,
   said control means being configured to enable a selection of any one of all of the following states:
      i) a substantially zero-attenuation state, in which said series switching element is switched into a conducting state, and said first and second further switching elements are switched into a non-conducting state;

ii) an isolation state, in which said series switching element and said third further switching element are switched into a non-conducting state, and said first and second further switching elements are switched into a conducting state; and iii) a finite attenuation state, in which said series switching element is switched into a non-conducting state, and said first, second and third further switching elements are switched into a conducting state.

5. The switching arrangement as claimed in claim 4, comprising also a further series switching element connected between a first port associated with a path in which no attenuation is provided and said common port, said further series switching element having a control terminal connected to said control means, said control means being configured to switch said further series switching element into a conducting state when said path is selected and into a non-conducting state when said path is not selected, said control means being configured to drive the control terminals of said third further switching element and said further series switching element in opposite senses.

6. The switching arrangement as claimed in claim 5, comprising also a shunt switching element connected between said first port associated with a non-attenuating path and a signal ground reference point, said shunt switching element having a control terminal connected to said control means, said control means being configured to switch said shunt switching element into a conductive state when said further series switching element is switched into its non-conductive state.

7. The switching arrangement as claimed in claim 4, wherein said impedance network is a T-network comprising a shunt resistance and a number of pairs of series resistances connected between said input and output terminals, tapping points being formed between adjacent resistances except those resistances at the center of the T-network, and wherein said first, second and third further switching elements constitute one of a corresponding number of sets of further switching elements, the second signal terminals of the first further switching elements of said sets of further switching elements being connected to respective successive tapping points working inwards from said input terminal towards said shunt resistance, and the second and third further switching elements of said sets of further switching elements being connected in series within each set, said second and third further switching elements being connected in series by their signal terminals between said second signal terminal of said series switching element and respective successive tapping points of said T-network working inwards from said output terminal towards said shunt resistance, said control means being configured to enable a selection of any one of a corresponding number of finite attenuation states in which a selected pair of further switching means is switched into a conductive state.

8. The switching arrangement as claimed in claim 4, wherein said arrangement is a multiplexing arrangement, said second signal terminal of said series switching element being connected to said common port.

9. The switching arrangement as claimed in claim 4, wherein said arrangement is a demultiplexing arrangement, said second signal terminal of said series switching element being connected to a first port.

\* \* \* \* \*